US010099958B2

(12) United States Patent
Brossard et al.

(10) Patent No.: US 10,099,958 B2
(45) Date of Patent: Oct. 16, 2018

(54) MATERIAL COMPRISING A FUNCTIONAL LAYER MADE FROM SILVER, CRYSTALLISED ON A NICKEL OXIDE LAYER

(71) Applicant: SAINT-GOBAIN GLASS FRANCE, Courbevoie (FR)

(72) Inventors: Sophie Brossard, Minneapolis, MN (US); Florent Martin, Minneapolis, MN (US)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 15/313,773

(22) PCT Filed: May 27, 2015

(86) PCT No.: PCT/FR2015/051403
§ 371 (c)(1),
(2) Date: Nov. 23, 2016

(87) PCT Pub. No.: WO2015/181500
PCT Pub. Date: Dec. 3, 2015

(65) Prior Publication Data
US 2017/0190611 A1    Jul. 6, 2017

(30) Foreign Application Priority Data

May 28, 2014 (FR) .................... 14 54860

(51) Int. Cl.
| *C23C 14/34* | (2006.01) |
| *C03C 17/36* | (2006.01) |
| *C23C 14/08* | (2006.01) |
| *C23C 14/18* | (2006.01) |
| *C23C 14/58* | (2006.01) |
| *C23C 14/10* | (2006.01) |
| *C23C 14/16* | (2006.01) |

(52) U.S. Cl.
CPC ........ *C03C 17/3681* (2013.01); *C03C 17/366* (2013.01); *C03C 17/3644* (2013.01); *C03C 17/3652* (2013.01); *C23C 14/08* (2013.01); *C23C 14/085* (2013.01); *C23C 14/086* (2013.01); *C23C 14/10* (2013.01); *C23C 14/165* (2013.01); *C23C 14/185* (2013.01); *C23C 14/5806* (2013.01); *C03C 2217/216* (2013.01); *C03C 2217/217* (2013.01); *C03C 2217/256* (2013.01); *C03C 2217/73* (2013.01); *C03C 2218/154* (2013.01); *C03C 2218/32* (2013.01)

(58) Field of Classification Search
CPC ....... C23C 14/08; C23C 14/10; C23C 14/165; C23C 14/5806
See application file for complete search history.

(56) References Cited

U.S. PATENT DOCUMENTS

| 5,527,396 A * | 6/1996 | Saitoh ................. C23C 16/517 118/718 |
| 2002/0021495 A1 | 2/2002 | Lingle |
| 2002/0064662 A1* | 5/2002 | Lingle ............... B32B 17/10009 428/432 |
| 2003/0031877 A1* | 2/2003 | Veerasamy ........... C03C 17/007 428/426 |
| 2003/0175529 A1 | 9/2003 | Stachowiak |
| 2004/0241406 A1 | 12/2004 | Nadaud et al. |
| 2006/0275613 A1* | 12/2006 | Butz ..................... C03C 17/36 428/432 |
| 2009/0214889 A1 | 8/2009 | Glenn et al. |
| 2013/0319847 A1* | 12/2013 | Ding .................... C23C 14/086 204/192.1 |

FOREIGN PATENT DOCUMENTS

| WO | WO 03/048060 A2 | 6/2003 |
| WO | WO 2008/096089 A2 | 8/2008 |
| WO | WO 2011/062574 A1 | 5/2011 |

OTHER PUBLICATIONS

International Preliminary Report on Patentability and the Written Opinion of the International Searching Authority as issued in International Patent Application No. PCT/FR2015/051403, dated Nov. 29, 2016.
International Search Report as issued in International Patent Application No. PCT/FR2015/051403, dated Sep. 17, 2015.

* cited by examiner

*Primary Examiner* — Jason Berman
(74) *Attorney, Agent, or Firm* — Pillsbury Winthrop Shaw Pittman LLP

(57) ABSTRACT

A process for obtaining a material including a transparent substrate coated with a stack of thin layers which are deposited by cathode sputtering, optionally assisted by a magnetic field, including at least one silver-based functional metal layer and at least two antireflective coatings, each antireflective coating including at least one dielectric layer, so that each functional metal layer is positioned between two antireflective coatings, the process includes the sequence of following stages: (a) an antireflective coating including at least one thin layer based on crystalline nickel oxide is deposited, then (b) at least one silver-based functional metal layer is deposited above and in contact with the thin layer based on crystalline nickel oxide.

9 Claims, No Drawings

MATERIAL COMPRISING A FUNCTIONAL LAYER MADE FROM SILVER, CRYSTALLISED ON A NICKEL OXIDE LAYER

CROSS-REFERENCE TO RELATED APPLICATIONS

This application is the U.S. National Stage of International Application Serial No. PCT/FR2015/051403, filed May 27, 2015, which in turn claims priority to French Application No. 1454860, filed May 28, 2014. The contents of all of these applications are incorporated herein by reference in their entirety.

The invention relates to a material and to a process for obtaining a material, such as a glazing, comprising a transparent substrate coated with a stack of thin layers comprising at least one silver-based functional metal layer.

Silver-based functional metal layers (or silver layers) have advantageous properties of electrical conduction and of reflection of infrared (IR) radiation, hence their use in "solar control" glazings targeted at reducing the amount of solar energy entering and/or in "low-e" glazings targeted at reducing the amount of energy dissipated towards the outside of a building or vehicle.

These silver layers are deposited between antireflective coatings which generally comprise several dielectric layers making it possible to adjust the optical properties of the stack. In addition, these dielectric layers make it possible to protect the silver layer from chemical or mechanical attacks.

The optical, electrical and mechanical properties of glazings depend directly on the quality of the silver layers, such as their crystalline state, their homogeneity and their environment, for example on the nature of the layers situated above and below and on the surface roughness of the interfaces.

The invention relates very particularly to a material which has to undergo a high-temperature heat treatment, such as an annealing, a bending and/or a tempering. These high-temperature heat treatments cause modifications within the silver layer and in particular generate defects. Some of these defects exist in the hole or dome form.

The defects of "hole" type correspond to the appearance of regions devoid of silver, that is to say to a partial dewetting of the silver layer. After heat treatment, the silver layer comprises holes of circular or dendritic shape corresponding to silver-free regions. The silver layer observed with a microscope appears flat. The thickness of this layer, taken at the regions with silver, does not vary by very much.

The defects of "dome" type correspond to the presence of "large" silver grains which cause variations in thickness within the silver layer, that is to say thickened regions and thinned regions. The variation of thickness can be pointwise, that is to say observed solely at these large grains. The silver layer can then have a homogeneous thickness except at these large grains. The variation of thickness can be more extensive as a result of a rearrangement of the silver layer around these large grains. These defects of "dome" type do not correspond to an intermediate state of defects of "hole" type.

The applicant has discovered that the occurrence and the type of defects, hole or dome, are a function of the nature of the dielectric layers constituting the antireflective coatings. For example, the presence of a dielectric layer based on tin zinc oxide in antireflective coatings promotes the formation of defects of dome type.

In order to improve the quality of silver-based functional metal layers, it is known to use antireflective coatings comprising dielectric layers having a stabilizing function which are intended to promote the wetting and the nucleation of the silver layer. Dielectric layers based on crystalline zinc oxide are in particular used for this purpose. This is because zinc oxide deposited by the cathode sputtering process crystallizes without requiring an additional heat treatment. The layer based on zinc oxide can thus act as epitaxial growth layer for the silver layer.

However, these layers of crystalline zinc oxide located below and in contact with a silver layer exhibit two disadvantages.

First, the adhesion between a layer based on zinc oxide and a silver layer is low. Consequently, all the stacks comprising the sequence of these two layers risk being mechanically damaged, this being the case a fortiori when they are subjected to a high-temperature heat treatment.

Secondly, a layer of silver crystallized by epitaxy on a layer based on zinc oxide predominantly comprises monocrystalline grains of silver exhibiting the planes of the {111} family parallel to the surface of the substrate. This can be demonstrated by Bragg-Brentano X-ray diffraction analyses. In the case of the silver which crystallizes in the form of a face-centered cubic structure, the planes of the {111} family are particularly dense. Furthermore, there exists a major difference between the unit cell parameters of the crystalline zinc oxide and of the silver, in particular of 11%. The growth by epitaxy of monocrystalline silver grains on zinc oxide grains brings about the formation of dislocations. These dislocations are so many point defects which can damage the resistivity.

In order to improve the quality of the silver-based functional metal layers, it is also known to use blocking layers, the function of which is to protect by preventing possible damage related to the deposition of an antireflective coating or related to a heat treatment. Numerous possibilities varying in particular in the nature, the number and the position of said blocking layers have been provided.

For example, it is possible to use a blocking layer or a blocking coating composed of several blocking layers. These blocking layers or coatings can be located solely above, solely below or both above and below the functional layer.

The choice of the nature and of the thickness of the blocking layers depends on the materials constituting the functional layer, on the materials constituting the antireflective coatings located in contact with the functional layer, on optional heat treatments and on the properties desired.

The complexity of the stacks and also the diversity of the treatments and properties desired make it necessary to adapt the characteristics of the blocking layer to each configuration.

Mention may be made, among the blocking layers conventionally used, of blocking layers based on a metal chosen from niobium Nb, tantalum Ta, titanium Ti, chromium Cr or nickel Ni or based on an alloy obtained from at least two of these metals, in particular on a nickel and chromium (NiCr) alloy.

The use of a blocking underlayer based on a nickel and chromium alloy makes it possible to limit the appearance of haze after heat treatment of tempering type while limiting the formation of holes or domes in the silver layer. However, the presence of these layers damages the emissivity, the absorption of the stack and the conductivity by promoting in particular the scattering of the electrons.

The use of a thick blocking underlayer based on titanium oxide makes it possible to limit the appearance of haze after heat treatment of tempering type without significantly increasing absorption of the stack.

However, these blocking layers weaken the beneficial effect related to the presence of a stabilizing layer intended to promote the crystallization of the silver, such as a layer of zinc oxide, when these blocking layers are inserted between the stabilizing layer and the silver layer. In the case of the epitaxial growth of the silver on the zinc oxide, the sheet resistance always remains damaged, whatever the blocking underlayer used.

The objective of the invention is to develop a material comprising a substrate coated with a stack exhibiting an improved mechanical strength, in particular by virtue of the improvement in adhesion of the silver layers to the remainder of the stack. Advantageously, these properties should be obtained while retaining a low resistivity.

The objective of the invention is also to develop a material comprising a substrate coated with a stack intended to be subjected to heat treatment exhibiting an improved mechanical strength, an improved resistance to haze, a low absorption and a low emissivity.

The advantageous properties should be obtained even when the stack comprises antireflective coatings comprising dielectric layers capable of generating defects of dome type in the silver-based functional layer.

The applicant has discovered that the presence of a thin layer based on crystalline nickel oxide directly in contact with the silver layer makes it possible to obtain the advantageous properties of the invention.

One of the essential characteristics of the invention is based on the fact that the silver-based functional layer is deposited on a layer based on nickel oxide crystallized beforehand. The thin layer based on crystalline nickel oxide acts as growth layer and orientates the crystallization of the silver along a plane of the {200} family with respect to the surface of the substrate.

The invention relates to a process for obtaining a material comprising a transparent substrate coated with a stack of thin layers which are deposited by cathode sputtering, optionally assisted by a magnetic field, comprising at least one silver-based functional metal layer and at least two antireflective coatings, each antireflective coating comprising at least one dielectric layer, so that each functional metal layer is positioned between two antireflective coatings, the process comprises the sequence of following stages:

(a) an antireflective coating comprising at least one thin layer based on crystalline nickel oxide is deposited, then
(b) at least one silver-based functional metal layer is deposited above and in contact with the thin layer based on crystalline nickel oxide.

The invention also relates to a material comprising a transparent substrate coated with a stack of thin layers comprising at least one silver-based functional metal layer and at least two antireflective coatings, each antireflective coating comprising at least one dielectric layer, so that each functional metal layer is positioned between two antireflective coatings, characterized in that the stack comprises at least one layer based on crystalline nickel oxide located below and in contact with a silver-based functional metal layer comprising several monocrystalline grains oriented so that they have the planes of the {200} family parallel to the surface of the substrate.

The material, that is to say the transparent substrate coated with the stack, can be intended to be subjected to a high-temperature heat treatment of tempering, annealing or bending type.

The use of a thin layer based on crystalline nickel oxide according to the invention as growth layer is particularly advantageous in stacks capable of generating defects of dome types after high-temperature heat treatment.

The use of such a thin layer is also particularly advantageous in temperable stacks for which the variations in emissivity and in absorption have to be minimal on tempering and the levels of haze low.

The presence of a layer based on nickel oxide increases the adhesion of the silver layer in the stack. Crystalline nickel oxide exhibits a face-centered cubic crystallographic structure similar to the crystallographic structure of the silver. The difference between the unit cell parameters of the crystalline nickel oxide and those of the silver is slight, in particular less than 2.2%. A layer of silver crystallized by epitaxy on a layer based on crystalline nickel oxide predominantly comprises monocrystalline silver grains exhibiting the planes of the {200} family parallel to the surface of the substrate. This texturing of the silver along the planes of the {200} family on nickel oxide in place of {111} on zinc oxide appears to contribute to better results in terms of adhesion being obtained.

Furthermore, the slight difference in the unit cell parameters also appears to contribute to reducing the number of dislocations, that is to say of point defects, capable of detrimentally effecting the sheet resistance of the stack.

The presence of the thin layer based on crystalline nickel oxide makes it possible to obtain a low sheet resistance, in particular virtually equal to that obtained in the case of the growth of the silver on a thin layer based on zinc oxide.

The thin layer based on crystalline nickel oxide makes it possible to obtain a better thermal stability and a better adhesion without damaging the sheet resistance, in contrast to what can be observed when blocking layers are used between the silver layer and the stabilizing layer.

Consequently, the use of a layer based on crystalline nickel oxide in total or partial replacement of a growth layer based on crystalline zinc oxide makes it possible to improve the mechanical and chemical properties without harming the electrical properties of the stack.

The use of a layer based on crystalline nickel oxide in contact with the silver-based functional metal layer makes it possible to significantly prevent dewetting and the appearance of defects of dome type in the silver layer when the coated substrate of the stack is subjected to a heat treatment of tempering type. The solution of the invention is thus very particularly suitable in the case of glazings comprising an antireflective coating comprising a dielectric layer capable of generating defects of dome type located below the silver-based functional metal layer.

According to an embodiment, the antireflective coating located below the silver-based functional layer comprising several monocrystalline grains oriented so that they have the family of {200} planes parallel to the surface of the substrate comprises a dielectric layer capable of generating defects of dome type chosen from layers based on tin and zinc oxide.

The invention also makes it possible to obtain superior performances, in particular a decrease in the haze, in the absorption in the visible region, in the emissivity and also of the mechanical strength of the complete stack subsequent to a heat treatment. These advantageous results are observed in particular by comparison with those obtained with stacks comprising blocking layers, for example based on nickel and chromium alloy, or with stacks not comprising the blocking layer.

Nickel oxide, in contrast to zinc oxide, does not crystallize under cold conditions under the deposition conditions of conventional cathode sputtering, that is to say under vacuum at ambient temperature, except if it is deposited on a crystalline layer, such as a layer of zinc oxide. The combination in the stack of a stabilizing layer of zinc oxide below a layer of nickel oxide makes it possible to crystallize the layer of nickel oxide and to subsequently obtain the crystallization of the silver with monocrystalline grains oriented so that they have the planes of the {200} family parallel to the surface of the substrate.

Consequently, it is necessary to adapt the cathode sputtering deposition process in order to crystallize the layer based on nickel oxide before deposition of the silver layer.

The crystallization of the layer of nickel oxide can be obtained by epitaxial growth. For this, a dielectric layer, such as a layer based on crystalline zinc oxide, is deposited below the layer based on nickel oxide. The process for obtaining a material according to the invention is such that, during stage (a):
  a layer capable of inducing crystallization by epitaxy, such as a layer based on crystalline zinc oxide, is deposited and then
  a layer based on nickel oxide is deposited above and in contact.

According to this embodiment, the antireflective coating located below the silver-based functional layer comprising several monocrystalline grains oriented so that they have the family of {200} planes parallel to the surface of the substrate comprises a dielectric layer having a stabilizing function based on zinc oxide located below and in contact with the layer based on crystalline nickel oxide.

The crystallization stage can also be carried out by a stage of crystallization heat treatment, for example by a laser treatment. In this case, it is not necessary for the layer based on nickel oxide to be deposited above a layer based on crystalline zinc oxide.

However, these two embodiments are advantageously combined: carrying out a crystallization heat treatment on a sequence of layers based on zinc oxide and based on nickel oxide, before deposition of the silver layer, makes it possible to obtain results which are even more exceptional in terms of sheet resistance and of adhesion of the stack.

The process for obtaining a material according to the invention is such that, during stage (a):
  a layer based on crystalline or noncrystalline nickel oxide is deposited and then
  the thin layer based on crystalline or noncrystalline nickel oxide is subjected to a crystallization heat treatment, before deposition of the silver-based functional metal layer.

The stack is deposited by cathode sputtering, in particular assisted by a magnetic field (magnetron process). Each layer of the stack can be deposited by cathode sputtering.

Unless otherwise mentioned, the thicknesses touched on in the present document are physical thicknesses. Thin layers are understood to mean a layer exhibiting a thickness of between 0.1 nm and 100 micrometers.

Throughout the description, the substrate according to the invention is regarded as positioned horizontally. The stack of thin layers is deposited above the substrate. The meaning of expressions "above" and "below" and "lower" and "upper" is to be considered with respect to this orientation. If there is no specific stipulation, the expressions "above" and "below" do not necessarily mean that two layers and/or coatings are positioned in contact with one another. When it is specified that a layer is deposited "in contact" with another layer or a coating, this means that there cannot be one or more layers inserted between these two layers.

The silver-based functional metal layer comprises at least 95.0%, preferably at least 96.5% and better still at least 98.0% by weight of silver, with respect to the weight of the functional layer. Preferably, the silver-based functional metal layer comprises less than 1.0% by weight of metals other than silver, with respect to the weight of the silver-based functional metal layer.

The thickness of the silver-based functional layers is, by order of increasing preference, of from 5 to 20 nm, from 8 to 15 nm.

The silver-based functional metal layers can be in contact with a blocking layer. A blocking underlayer corresponds to a blocking layer positioned under a functional layer, a position defined with respect to the substrate. A blocking layer positioned on the functional layer on the opposite side from the substrate is known as blocking overlayer. The blocking overlayers are chosen from layers based on NiCr, NiCrN, NiCrO$_x$, NiO or NbN. The thickness of each blocking overlayer or underlayer is preferably:
  at least 0.5 nm or at least 0.8 nm and/or
  at most 5.0 nm or at most 2.0 nm.

According to the invention, the layers based on crystalline nickel oxide can provide the function of blocking underlayer. The thickness of each layer based on crystalline nickel oxide is preferably:
  at least 0.5 nm, at least 0.8 nm, and/or between 0.8 and 5 nm,
  at most 5.0 nm, at most 3.0 nm or at most 2.0 nm.

The dielectric layers of the antireflective coatings exhibit the following characteristics, alone or in combination:
  they are deposited by cathode sputtering assisted by a magnetic field,
  they are chosen from dielectric layers having a barrier function and/or dielectric layers having a stabilizing function,
  they are chosen from oxides or nitrides of one or more elements chosen from titanium, silicon, aluminum, tin and zinc,
  they have a thickness of greater than 5 nm, preferably of between 8 and 35 nm.

Dielectric layers having a stabilizing function is understood to mean a layer made of a material capable of stabilizing the interface between the functional layer and this layer. Dielectric layers having a stabilizing function are preferably based on crystalline oxide, in particular based on zinc oxide, optionally doped using at least one other element, such as aluminum. The dielectric layer or layers having a stabilizing function are preferably layers of zinc oxide.

The dielectric layer or layers having a stabilizing function can be found above and/or below at least one silver-based functional metal layer or each silver-based functional metal layer, either directly in contact with it or separated by a layer of nickel oxide or by a blocking layer. Preferably, each silver-based functional metal layer is above an antireflective coating, the upper layer of which is a layer of nickel oxide according to the invention deposited above and in contact with a dielectric layer having a stabilizing function, preferably based on zinc oxide.

The dielectric layers having a stabilizing function can have a thickness of at least 3 nm, in particular a thickness of between 3 and 25 nm and better still from 5 to 10 nm.

Dielectric layers having a barrier function is understood to mean a layer made of a material capable of forming a barrier to the diffusion of oxygen and water at high temperature, originating from the surrounding atmosphere or from the transparent substrate, toward the functional layer. The dielectric layers having a barrier function can be based on silicon compounds chosen from oxides, such as $SiO_2$, nitrides of silicon $Si_3N_4$ and oxynitrides $SiO_xN_y$, optionally doped using at least one other element, such as aluminum, based on aluminum nitrides AlN or based on tin zinc oxide.

The transparent substrate coated with the stack intended to be subjected to a heat treatment can comprise:
- an antireflective coating comprising at least one layer based on crystalline nickel oxide,
- a silver-based functional metal layer,
- optionally a blocking layer,
- an antireflective coating.

According to an advantageous embodiment, the stack can comprise, starting from the substrate:
- an antireflective coating located below the silver-based functional metal layer comprising at least one dielectric layer having a stabilizing function based on zinc oxide and at least one layer based on crystalline nickel oxide located in contact with the dielectric layer having a stabilizing function based on zinc oxide,
- a silver-based functional metal layer located in contact with the layer based on crystalline nickel oxide,
- optionally a blocking overlayer,
- an antireflective coating located above the silver-based functional metal layer,
- optionally an upper protective layer.

According to another advantageous embodiment, the stack can comprise, starting from the substrate:
- an antireflective coating comprising at least one dielectric layer having a barrier function, at least one dielectric layer having a stabilizing function and at least one layer based on crystalline nickel oxide,
- a silver-based functional metal layer located in contact with the layer based on crystalline nickel oxide,
- optionally a blocking overlayer,
- an antireflective coating comprising at least one dielectric layer having a stabilizing function and a dielectric layer having a barrier function.

The stack can comprise an upper protective layer deposited as final layer of the stack, in particular in order to confer scratch-resistant properties. These upper protective layers preferably have a thickness of between 2 and 5 nm. These protective layers can be layers of titanium oxide or of tin zinc oxide.

The transparent substrates according to the invention are preferably made of a rigid inorganic material, such as made of glass, in particular soda-lime-silica glass. The thickness of the substrate generally varies between 0.5 mm and 19 mm. The thickness of the substrate is preferably less than or equal to 6 mm, indeed even 4 mm.

The crystallization heat treatment of the layer based on nickel oxide before deposition of the silver-based functional metal layer can be carried out by any heating process. This treatment can be carried out by placing the substrate in an oven or a stove or by subjecting the substrate to radiation.

The crystallization heat treatment is advantageously carried out by subjecting the substrate coated with the layer to be treated to radiation, preferably laser radiation focused on said layer in the form of at least one laser line.

The crystallization heat treatment can be carried out by contributing energy capable of carrying each point of the layer based on nickel oxide to a temperature preferably of at least 300° C., in particular 350° C., indeed even 400° C., and even 500° C. or 600° C. Each point of the coating is subjected to the heat treatment for a period of time of less than or equal to 1 second, indeed even 0.5 second and advantageously within a range extending from 0.05 to 10 ms, in particular from 0.1 to 5 ms or from 0.1 to 2 ms.

The wavelength of the radiation is preferably within a range extending from 500 to 2000 nm, in particular from 700 to 1100 nm, indeed even from 800 to 1000 nm. High-power laser diodes which emit at one or more wavelengths chosen from 808 nm, 880 nm, 915 nm, 940 nm or 980 nm have proved to be particularly well suited.

The crystallization heat treatment can also be carried out by subjecting the substrate to infrared radiation resulting from conventional heating devices, such as infrared lamps.

The heat treatment is advantageously carried out so that each point of the layer is brought to a temperature of at least 300° C. while maintaining, at every point, the face of the substrate opposite that comprising the stack at a temperature of less than or equal to 150° C.

"Point of the layer" is understood to mean a region of the layer which is subjected to the treatment at a given instant. According to the invention, all of the layer (thus each point) is brought to a temperature of at least 300° C. but each point of the layer is not necessarily treated simultaneously. The layer can be treated at the same instant in its entirety, each point of the layer being simultaneously brought to a temperature of at least 300° C. The layer can alternatively be treated so that the different points of the layer or assemblages of points are successively brought to a temperature of at least 300° C., this second method being more often employed in the case of continuous processing on the industrial scale.

These heat treatments exhibit the advantage of heating only the layer, without significant heating of the whole of the substrate, i.e. a moderate and controlled heating of a limited region of the substrate, and thus of preventing breakage problems. It is thus preferable for the implementation of the present invention for the temperature of the face of the substrate opposite the face carrying the treated layer exhibiting a stress jump not to be greater than 150° C., preferably less than or equal to 100° C., in particular less than or equal to 50° C. This characteristic is obtained by choosing a method of heating especially suitable for the heating of the layer and not of the substrate and by controlling the time or the intensity of heating and/or other parameters as a function of the heating method employed. Preferably, each point of the thin layer is subjected to the treatment according to the invention (that is to say, brought to a temperature of greater than or equal to 300° C.) for a period of time generally of less than or equal to 1 second, indeed even 0.5 second.

In order to limit as much as possible the number of breakages for the biggest substrates (for example of 6 m in length by 3 m in width), a temperature of less than or equal to 100° C., in particular 50° C., is preferably maintained throughout the treatment at every point of the face of the substrate opposite the face on which the layer exhibiting a stress jump is deposited.

The parameters of the heating, such as the power of the heating means or the heating time, can be adjusted on a case by case basis by a person skilled in the art as a function of various parameters, such as the nature of the heating process, the thickness of the layer, the size and the thickness of the substrates to be treated, and the like.

The crystallization heat treatment stage preferably consists in subjecting the substrate coated with the layer to be treated to radiation, preferably laser radiation focused on said layer in the form of at least one laser line. As lasers can only irradiate a small surface area (typically of the order of a fraction of an $mm^2$ to a few hundred $mm^2$), it is necessary, in order to treat the entire surface, to provide a system for moving the laser beam in the plane of the substrate or a system forming an inline laser beam simultaneously irradiating the entire width of the substrate and under which the latter passes to progress forward.

The maximum temperature is normally undergone at the moment when the point of the coating under consideration passes under the laser line. At a given instant, only the points of the surface of the coating located under the laser line and in its immediate surroundings (for example, at less than one millimeter) are normally at a temperature of at least 300° C. For distances to the laser line (measured along the direction of forward progression) of greater than 2 mm, in particular 5 mm, including downstream of the laser line, the temperature of the coating is normally at most 50° C. and even 40° C. or 30° C.

The laser radiation is preferably generated by modules comprising one or more laser sources and also forming and redirecting optics.

The laser sources are typically laser diodes or fiber or disk lasers. Laser diodes make it possible to economically achieve high power densities, with respect to the electrical supply power, for a small space requirement.

The radiation resulting from the laser sources is preferably continuous.

The forming and redirecting optics preferably comprise lenses and mirrors, and are used as means for positioning, homogenizing and focusing the radiation.

The purpose of the positioning means is, if appropriate, to arrange along a line the radiation emitted by the laser sources. They preferably comprise mirrors. The purpose of the homogenizing means is to superimpose the spatial profiles of the laser sources in order to obtain a linear power density which is homogeneous all along the line. The homogenizing means preferably comprise lenses which make possible the separation of the incident beams into secondary beams and the recombination of said secondary beams into a homogenous line. The means for focusing the radiation make it possible to focus the radiation on the coating to be treated, in the form of a line of desired length and desired width. The focusing means preferably comprise a convergent lens.

When just one laser line is used, the length of the line is advantageously equal to the width of the substrate.

The linear power density of the laser line is preferably at least 300 W/cm, advantageously 350 or 400 W/cm, in particular 450 W/cm, indeed even 500 W/cm and even 550 W/cm. It is even advantageously at least 600 W/cm, in particular 800 W/cm, indeed even 1000 W/cm. The linear power density is measured at the spot where the or each laser line is focused on the coating. It can be measured by positioning a power detector along the line, for example a calorimetric power meter, such as, in particular, the Beam-Finder S/N 2000716 power meter from Coherent Inc. The power density is advantageously distributed homogeneously along the whole length of the or each line. Preferably, the difference between the highest power density and the lowest power density has a value which is less than 10% of the mean power density.

The energy density provided to the coating is preferably at least 20 J/cm$^2$, indeed even 30 J/cm$^2$.

The high power densities and energy densities make it possible to heat the coating very rapidly, without significantly heating the substrate.

Preferably, the or each laser line is stationary and the substrate is in motion, with the result that the rates of relative displacement will correspond to the rate of forward progression of the substrate.

The crystallization heat treatment can be carried out during the deposition in the deposition chamber, or on conclusion of deposition, outside the deposition chamber. The crystallization heat treatment can be carried out under vacuum, under air and/or at atmospheric pressure. The heat treatment outside the deposition chamber is not preferred as it can cause pollution problems.

The crystallization heat treatment can be carried out under vacuum actually within the chamber for the deposition by cathode sputtering. Preferably, all the layers of the stack are produced and the crystallization heat treatment is carried out in the chamber for deposition by cathode sputtering.

The heat treatment device can thus be incorporated in a line for deposition of layers, for example a line for deposition by cathode sputtering assisted by a magnetic field (magnetron process). The line generally comprises devices for handling the substrates, a deposition unit, optical control devices and stacking devices. The substrates progress forward, for example on conveying rollers, successively past each device or each unit.

The heat treatment device can be incorporated in the deposition unit. For example, the laser can be introduced into one of the chambers of a unit for deposition by cathode sputtering, in particular into a chamber where the atmosphere is rarified, in particular under a pressure of between $10^{-6}$ mbar and $10^{-2}$ mbar. The heat treatment device can also be positioned outside the deposition unit but so as to treat a substrate located inside said unit. It is sufficient to provide, for this purpose, a porthole transparent to the wavelength of the radiation used, through which the laser radiation would pass to treat the layer. It is thus possible to treat a layer before the subsequent deposition of another layer in the same unit. The heat treatment is preferably a laser treatment by radiation in a system where the laser is incorporated in a magnetron device.

Preferably, the heat treatment is carried out under vacuum actually within the deposition chamber of the magnetron device.

The crystallization heat treatment can also be carried out by heating using infrared radiation, a plasma torch or a flame, as described in the application WO 2008/096089.

Systems of infrared lamps in combination with a focusing device (for example, a cylindrical lens), making it possible to achieve high powers by unit of surface area, can also be used.

The crystallization heat treatment is preferably a laser treatment incorporated in a chamber for deposition by cathode sputtering.

The transparent substrates according to the invention are preferably made of a rigid inorganic material, such as made of glass, in particular soda-lime-silica glass. The thickness of the substrate generally varies between 0.5 mm and 19 mm. The thickness of the substrate is preferably less than or equal to 6 mm, indeed even 4 mm.

The coated transparent substrate can be subjected to a heat treatment at high temperature chosen from an annealing, for example from a flash annealing, such as a laser or flame annealing, a tempering and/or a bending. The temperature of the heat treatment is greater than 400° C., preferably greater than 450° C. and better still greater than 500° C. This heat treatment, carried out on the complete stack, differs from the crystallization heat treatment. The process can additionally comprise stage (c), during which the substrate coated with the stack of thin layers is subjected to a heat treatment at a temperature greater than 400° C., preferably 500° C.

The substrate coated with the stack can be is a bent and/or tempered glass.

The material can be in the form of a monolithic glazing, a laminated glazing or of a multiple glazing, in particular a double glazing or a triple glazing.

The material of the invention is suitable in all applications requiring the use of a low-e stack comprising silver layers for which a low resistivity is a key parameter.

EXAMPLES

Stacks of thin layers defined below are deposited on substrates made of clear soda-lime glass with a thickness of 2 mm.

For these examples, the conditions for deposition of the layers deposited by sputtering ("magnetron cathode" sputtering) are summarized in table 1 below.

The layers of titanium oxide deposited as dielectric layer of the antireflective coating or as blocking layer can be completely or partially oxidized. For this, a ceramic target of substoichiometric TiOx is used and deposition is carried out in an oxidizing atmosphere, in order to obtain a completely oxidized layer of $TiO_2$, or in an inert atmosphere, in order to obtain a substoichiometric layer.

For some examples, the thicknesses of the layers are varied by modifying the deposition power.

TABLE 1

| | Targets employed | Deposition pressure | Gas | Index* |
|---|---|---|---|---|
| $Si_3N_4$ | Si:Al (92:8% by wgt) | $1.5 * 10^{-3}$ mbar | Ar 47%—$N_2$ 53% | 2.00 |
| ZnO | Zn:Al (98:2% by wgt) | $1.5 * 10^{-3}$ mbar | Ar 91%—$O_2$ 9% | 2.04 |
| NiCr | Ni:Cr (80:20 at. %) | $2 * 10^{-3}$ mbar | Ar at 100% | — |
| Ag | Ag | $8 * 10^{-3}$ mbar | Ar at 100% | — |
| $TiO_2$ | TiOx | $1.5 * 10^{-3}$ mbar | Ar 88%—$O_2$ 12% | 2.32 |
| SnZnO | Sn:Zn (60:40% by wgt) | $1.5 * 10^{-3}$ mbar | Ar 39%—$O_2$ 61% | 2.09 |
| NiO | Ni | $2.5 * 10^{-3}$ mbar | Ar 97%—$O_2$ 3% | — | at.: atomic;
wgt: weight;
*at 550 nm

The materials and the physical thicknesses in nanometers (unless otherwise indicated) of each layer or coating which constitutes the stacks are listed in the tables below as a function of their positions with respect to the substrate carrying the stack.

| | | Comparative | | | According to the invention | | | | |
|---|---|---|---|---|---|---|---|---|---|
| Glazing | | C1a | C1b | A1a | A1b | A2a | A2b | A3a | A3b |
| Antireflective coating | $Si_3N_4$ | 10 | 10 | 10 | 10 | 10 | 10 | 10 | 10 |
| | ZnO | 5 | 5 | 5 | 5 | 5 | 5 | 5 | 5 |
| Blocking layer OB | NiCr | 0.5 | 0.5 | 0.5 | 0.5 | 0.5 | 0.5 | 0.5 | 0.5 |
| Functional layer | Ag | 10 | 10 | 10 | 10 | 10 | 10 | 10 | 10 |
| Antireflective coating | NiO | — | — | 10 | 10 | 1 | 1 | 5 | 5 |
| | ZnO | 10 | 10 | — | — | 10 | 10 | 5 | 5 |
| | $Si_3N_4$ | 30 | 30 | 30 | 30 | 30 | 30 | 30 | 30 |
| Substrate (mm) | glass | 2 | 2 | 2 | 2 | 2 | 2 | 2 | 2 |
| Crystallization heat treatment | — | no | yes | no | yes | no | yes | no | yes |

| | | Comparative | | | | | According to the invention | | |
|---|---|---|---|---|---|---|---|---|---|
| Glazing | | C2a | C2b | C3a | C3b | C5 | A4a | A4b | A6 |
| Upper protective layer | $TiO_2$ | 2 | 2 | 2 | 2 | 2 | 2 | 2 | 2 |
| Antireflective coating | $Si_3N_4$ | 30 | 30 | 30 | 30 | 30 | 30 | 30 | 30 |
| | ZnO | 5 | 5 | 5 | 5 | 5 | 5 | 5 | 5 |
| Blocking layer OB | NiCr | 0.5 | 0.5 | 0.5 | 0.5 | 0.5 | 0.5 | 0.5 | 0.5 |
| Functional layer | Ag | 10 | 10 | 10 | 10 | 10 | 10 | 10 | 10 |
| Antireflective coating | NiO | — | — | 10 | 10 | — | 1 | 1 | 1 |
| | ZnO | 10 | 10 | — | — | 10 | 10 | 10 | 10 |
| | $Si_3N_4$ | 30 | 30 | 30 | 30 | 30 | 30 | 30 | 30 |
| Substrate (mm) | glass | 2 | 2 | 2 | 2 | 4 | 2 | 2 | 4 |
| Crystallization heat treatment | — | no | no | no | no | no | no | no | no |
| Heat treatment Complete stack | — | no | yes | no | yes | no | no | yes | no |

A crystallization heat treatment can be carded out before deposition of the silver-based functional layer by laser treatment. For the examples described above, the heat treatment of the complete stack is also carried out by laser treatment.

| Glazings | | Comparative | | | | | | | According to the invention | | |
|---|---|---|---|---|---|---|---|---|---|---|---|
| | | 1 | 2 | 3 | 4 | 5 | 6 | 7 | 8 | 9 | 10 |
| Protective layer | $TiO_2$ | 2 | 2 | 2 | 2 | 2 | 2 | 2 | 2 | 2 | 2 |
| Antireflective coating | $Si_3N_4$ | 30 | 30 | 30 | 30 | 30 | 30 | 30 | 30 | 30 | 30 |
| | ZnO | 5 | 5 | 5 | 5 | 5 | 5 | 5 | 5 | 5 | 5 |
| Blocking layer | NiCr | 0.5 | 0.5 | 0.5 | 0.5 | 0.5 | 0.5 | 0.5 | 0.5 | 0.5 | 0.5 |
| Functional layer | Ag | 10 | 10 | 10 | 10 | 10 | 10 | 10 | 10 | 10 | 10 |
| Blocking layer | NiCr | — | 0.5 | 1 | 3 | — | — | — | — | — | — |
| | $TiO_x$ | — | — | — | — | 0.5 | 1 | 3 | — | — | — |
| Growth layer | NiO | — | — | — | — | — | — | — | 0.5 | 1 | 3 |
| Antireflective coating | ZnO | 5 | 5 | 5 | 5 | 5 | 5 | 5 | 5 | 5 | 5 |
| | $SnZnO_x$ | 30 | 30 | 30 | 30 | 30 | 30 | 30 | 30 | 30 | 30 |
| Substrate (mm) | glass | 2 | 2 | 2 | 2 | 2 | 2 | 2 | 2 | 2 | 2 |
| Heat treatment Complete stack | | yes | yes | yes | yes | yes | yes | yes | yes | yes | yes |

For the examples described above, the heat treatment of the complete stack is carried out in a Naber furnace simulating a tempering with an annealing at 620° C. or 680° C. for 10 minutes.

I. Evaluation of the Sheet Resistance

The sheet resistance (Rs), corresponding to the resistance of a sample with a width equal to the length (for example, 1 meter) and with any thickness, is measured on a Napson device. The first test series compares the effect of the nature of the growth layer and of its method of crystallization. The sheet resistance results obtained for coated substrates which have or have not been subjected to a crystallization heat treatment are taken up in the table below.

| Glazing | C1a | C1b | A1a | A1b | A2a | A2b | A3a | A3b |
|---|---|---|---|---|---|---|---|---|
| Rs (±0.05 ohm) | 5.53 | 5.55 | 5.80 | 5.66 | 5.28 | 5.15 | 5.55 | 5.27 |

A crystallization heat treatment carried out before deposition of the silver layer on the material of the prior art not comprising a growth layer based on nickel oxide does not have a positive effect on the sheet resistance.

Example A1a illustrates a material comprising a layer of noncrystalline or not very crystalline nickel oxide before deposition of the silver layer. This is because this layer is not deposited on a layer capable of inducing crystallization by epitaxy and no crystallization treatment is carried out. The sheet resistance of this material is thus high. By comparison, example A1b according to the invention differs in that a crystallization heat treatment was carried out before deposition of the silver layer. The sheet resistance of this material is lower than that of example A1a. The layer of crystalline nickel oxide can make it possible to lower the sheet resistance values.

Examples A2a and A3a illustrate materials according to the invention comprising a layer of nickel oxide crystallized before deposition of the silver layer. This is because the layer of nickel oxide is deposited on a layer of zinc oxide capable of inducing crystallization by epitaxy. The two materials thus prepared without crystallization heat treatment have a low sheet resistance, in particular at least as good as that of the material C1a comprising solely a layer based on zinc oxide. It is interesting to note that, without additional crystallization heat treatment, the best results are obtained for the material A2a comprising the sequence layer based on zinc oxide and layer based on nickel oxide of low thickness.

Finally, examples A2b and A3b illustrate materials according to the invention comprising a layer of nickel oxide crystallized before deposition of the silver layer. The crystallization is obtained both by epitaxy, as the layer of nickel oxide is deposited on a layer of zinc oxide capable of inducing crystallization, and by additional crystallization heat treatment using a laser. The two materials thus prepared have a low sheet resistance, in particular lower than that of the materials A2a and A3a not comprising the additional crystallization heat treatment. This reflects the synergistic effect of the crystallization both by epitaxy and by heat treatment on a low sheet resistance value being obtained. Finally, the best results are obtained for the material A2b comprising the sequence of a layer based on zinc oxide and of a layer based on nickel oxide of low thickness.

The second test series demonstrates the importance of the crystallization of the layer based on nickel oxide before deposition of the silver layer. The sheet resistance results obtained for coated substrates:

which have not been subjected to a crystallization heat treatment,
which have or have not been subjected to a heat treatment carried out on the complete stack, are taken up in the table below.

For this, the laser heat treatment is cared out on the complete stack.

| Glazing | C2a | C2b | C3a | C3b | A4a | A4b |
|---|---|---|---|---|---|---|
| Rs (±0.05 ohm) | 4.89 | 3.97 | 6.02 | 4.80 | 5.21 | 4.22 |

A heat treatment carried out on the complete stack results in all cases in a decrease in the sheet resistance values. However, it is observed that the lowest sheet resistance values are obtained for the material of the prior art not comprising a growth layer based on nickel oxide but only a layer of zinc oxide. The silver-based functional layer absolutely has to be deposited on a growth layer based on crystalline nickel oxide in order to obtain a positive effect related to the presence of this layer. A heat treatment after deposition of the silver layer does not make it possible to obtain an improvement in terms of sheet resistance with respect to a stack of the prior art comprising only a layer of zinc oxide.

II. Evaluation of the Mechanical Strength: Peel Test

The mechanical strength was evaluated by a peel test which gives information on the cohesion of the layers constituting the stack. This peel test consists in causing a PVB sheet to adhere, under the application of heat and pressure, to the substrate coated with the stack. The PVB layer placed in contact with the stack is then separated at one end and is folded back and pulled from the coated substrate under an angle of application of force of 180 degrees. The force necessary to tear off the PVB sheet is a measurement of the adhesion of the PVB sheet to the stack and of the cohesion of the layers.

| Glazing | C5 | A6 |
|---|---|---|
| Tearing-off force (N) | 3.2 | 12.5 |

These tests were carried out on the materials which have not been subjected to the high-temperature heat treatment. They clearly demonstrate the better adhesion of the combined stack related to the presence of the layer of nickel oxide crystallized before deposition of the silver layer. This excellent adhesion of the silver to the nickel oxide contributes to a better durability in the heat treatment being obtained for the stack comprising a layer based on crystalline nickel oxide below and in contact with a silver layer.

II. Optical Properties

The optical characteristics were measured for simple glazings comprising a 2 mm glass on which the stack is deposited.

These tests show the influence of the nature and of the thickness of the blocking underlayers on the optical properties before and after heat treatment.

The following characteristics were measured and combined in the table below:
the emissivity values as percentage (s) calculated according to the standard EN 12898 before and after heat treatment,
the values of absorption (Abs) before heat treatment and the haze evaluated by measuring after heat treatment.

The haze was evaluated by measuring the mean visible diffuse reflection with a Perkin-Elmer L900 spectrometer. The measurement consists in arriving at the mean of the diffused part of the reflection over the visible region, the specular reflection being excluded from the measurement and the base line taken on a nonhaze reference sample being subtracted. It is expressed as percentage with respect to a total reflection measured on a reference mirror.

| | Before heat treatment | | After heat treatment | |
|---|---|---|---|---|
| Glazing | ε % | Abs % | ε % | Haze % |
| 1 | 4.49 | 6.6 | 11.44 | 1.22 |
| 2 | 6.05 | 11.9 | 4.81 | 0.34 |
| 3 | 5.83 | 14.8 | 4.75 | 0.13 |
| 4 | 5.40 | 26.4 | 4.87 | 0.29 |
| 5 | 5.62 | 8.1 | 4.11 | 0.23 |
| 6 | 5.64 | 8.0 | 5.20 | 0.37 |
| 7 | 5.55 | 8.0 | 4.54 | 0.30 |
| 8 | 4.93 | 7.9 | 4.37 | 1.45 |
| 9 | 4.86 | 7.8 | 4.68 | 0.34 |
| 10 | 4.78 | 8.0 | 4.36 | 0.58 |

Glazings 1 to 10 comprise a dielectric layer based on tin zinc oxide (SnZnO) in the antireflective coating located below the silver-based functional metal layer. The applicant has discovered that the presence of a layer of this nature and in this position of the stack promotes the formation of defects of dome type after heat treatment. The choice of the blocking layer located below the functional layer accentuates or decreases this tendency.

The addition of a blocking underlayer brings about an increase in the absorption in the visible region before tempering. However, the increase is weaker in the case of the use of an oxide-based blocking underlayer. Blocking layers based on nickel and chromium greatly increase the absorption in the visible region.

The addition of a layer according to the invention based on crystalline nickel oxide and of low thickness does not produce a significant variation in the emissivity values before and after heat treatment, contrary to the addition of an underlayer based on nickel and chromium.

After heat treatment, the glazings according to the invention exhibit a lower emissivity than that obtained with a blocking underlayer based on nickel and chromium. To obtain a low emissivity reports a reduction in the energy losses by radiation and thus an improvement in the thermal performance of the double glazing.

Specifically, the glazings comprising a blocking underlayer based on an alloy of nickel and chromium exhibit correct haze values but do not exhibit the advantageous properties of the invention in terms of emissivity and absorption.

The use of a blocking layer based on crystalline nickel oxide exhibiting a thickness of the order of 1 nm makes possible a significant decrease in the haze in comparison with a material devoid of blocking underlayer. It also makes possible a decrease in the haze at least equivalent to that obtained with a 0.5 nm blocking underlayer based on nickel and chromium conventionally used. However, in particular, the growth layer according to the invention makes it possible to obtain the lowest absorptions and the lowest values of emissivities, even before heat treatment, in comparison with the other blocking underlayers.

The invention claimed is:

1. A process for obtaining a material comprising a transparent substrate coated with a stack of thin layers which are deposited by cathode sputtering, the stack of thin layers comprising at least one silver-based functional metal layer and at least two antireflective coatings, each antireflective coating comprising at least one dielectric layer, so that each functional metal layer is positioned between two antireflective coatings, the process comprising:
  (a) depositing an antireflective coating comprising at least one thin layer based on crystalline or noncrystalline nickel oxide, then
  (b) depositing at least one silver-based functional metal layer above and in contact with the thin layer based on crystalline nickel oxide,
    wherein stage (a) comprises subjecting the at least one thin layer based on crystalline or noncrystalline nickel oxide to a crystallization heat treatment, before deposition of the silver-based functional metal layer, the heat treatment being carried out so that each point of the layer is brought to a temperature of at least 300° C. while maintaining, at every point, the face of the substrate opposite that comprising the stack at a temperature of less than or equal to 150° C.

2. The process for obtaining a material as claimed in claim 1, comprising, during stage (a):
  depositing a layer capable of inducing crystallization by epitaxy and then
  depositing a layer based on nickel oxide above and in contact with the layer capable of inducing crystallization by epitaxy.

3. The process for obtaining a material as claimed in claim 1, comprising, during stage (a):

depositing a layer based on crystalline zinc oxide and then depositing a layer based on nickel oxide above and in contact with the layer based on crystalline zinc oxide.

4. The process for obtaining a material as claimed in claim 1, wherein the crystallization heat treatment is carried out by contributing energy capable of carrying each point of the thin layer based on crystalline or noncrystalline nickel oxide to a temperature of greater than or equal to 300° C.

5. The process for obtaining a material as claimed in claim 1, wherein all the layers of the stack are produced and a crystallization heat treatment is carried out in a chamber for deposition by cathode sputtering.

6. The process for obtaining a material as claimed in claim 1, further comprising stage (c) during which the substrate coated with the stack of thin layers is subjected to a heat treatment at a temperature greater than 400° C.

7. The process for obtaining a material as claimed in claim 6, wherein the temperature is greater than 500° C.

8. The process for obtaining a material as claimed in claim 1, wherein the cathode sputtering is assisted by a magnetic field.

9. The process for obtaining a material as claimed in claim 1, wherein the at least one thin layer based on crystalline nickel oxide is devoid of a nickel and chromium alloy.

* * * * *